United States Patent
Lin et al.

(10) Patent No.: US 9,570,518 B2
(45) Date of Patent: Feb. 14, 2017

(54) LIGHT EMITTING ELEMENT

(71) Applicant: Industrial Technology Research Institute, Chutung, Hsinchu (TW)

(72) Inventors: Yi-Ping Lin, Hsinchu (TW); Jung-Yu Li, Hsinchu (TW); Guan-Yu Chen, Hsinchu (TW); Jin-Han Wu, Hsinchu (TW); Cheng-Hung Li, Hsinchu (TW); Shih-Pu Chen, Hsinchu (TW)

(73) Assignee: INDUSTRIAL TECHNOLOGY RESEARCH INSTITUTE, Chutung Township (TW)

( * ) Notice: Subject to any disclaimer, the term of this patent is extended or adjusted under 35 U.S.C. 154(b) by 0 days.

(21) Appl. No.: 14/329,445

(22) Filed: Jul. 11, 2014

(65) Prior Publication Data

US 2015/0187846 A1 Jul. 2, 2015

(30) Foreign Application Priority Data

Jan. 2, 2014 (TW) .............................. 103100018 A
Jun. 5, 2014 (TW) .............................. 103119495 A

(51) Int. Cl.
*H01L 27/32* (2006.01)
*H01L 33/42* (2010.01)

(52) U.S. Cl.
CPC ................... *H01L 27/3211* (2013.01)

(58) Field of Classification Search
CPC ................... H01L 27/32; H01L 33/42

(Continued)

(56) References Cited

U.S. PATENT DOCUMENTS 5,805,136 A 9/1998 Silverbrook et al.
6,320,322 B1* 11/2001 Tanaka ...................... 315/169.3
(Continued)

FOREIGN PATENT DOCUMENTS

TW 538398 B 6/2003
TW I381542 B 1/2013

OTHER PUBLICATIONS

Hori et al., "Development and Mass-Production of an OLED Lighting Panel Most-Promising Next-Generation Lighting," *Mitsubishi Heavy Industries Technical Review*, 49(1):47-53 (2012).

(Continued)

*Primary Examiner* — Sheng Zhu
(74) *Attorney, Agent, or Firm* — McCarter & English, LLP; Yu Lu

(57) ABSTRACT

A light emitting element is provided, including a first electrode layer, a second electrode layer, and an organic light emitting layer sandwiched between the first electrode layer and the second electrode layer. The organic light emitting layer is patterned to include a plurality of light emitting blocks with different densities. In an embodiment, the light emitting blocks are divided into a plurality of light emitting block groups that are arranged in an alternate manner. In another embodiment, a light emitting element includes a first electrode layer, a first organic light emitting layer, a charge generating layer, a second organic light emitting layer, and a second electrode layer sequentially stacked on one another. The first and second organic light emitting layer are patterned to form a plurality of first and second light emitting blocks with different densities, respectively. Thus, the light emitting element generates full-color, gray-scale, three-dimensional, or dynamic images.

21 Claims, 12 Drawing Sheets

(58) Field of Classification Search
USPC .................................. 257/40, 88.93; 438/690
See application file for complete search history.

(56) References Cited

U.S. PATENT DOCUMENTS

| | | | |
|---|---|---|---|
| 6,692,845 B2* | 2/2004 | Maruyama et al. | 428/690 |
| 6,872,472 B2* | 3/2005 | Liao et al. | 428/690 |
| 7,227,305 B2* | 6/2007 | Liu et al. | 313/506 |
| 7,342,249 B2 | 3/2008 | Park et al. | |
| 7,492,337 B2* | 2/2009 | Fukase | 345/76 |
| 7,733,014 B2* | 6/2010 | Iou | 313/506 |
| 7,825,584 B2* | 11/2010 | Kim | 313/504 |
| 2004/0227703 A1 | 11/2004 | Lamvik et al. | |
| 2007/0040496 A1* | 2/2007 | Yu et al. | 313/506 |
| 2010/0264816 A1* | 10/2010 | Cok | 313/506 |
| 2011/0180836 A1* | 7/2011 | Son | 257/98 |
| 2013/0105833 A1 | 5/2013 | Weaver et al. | |

OTHER PUBLICATIONS

Jiang et al., "Design of passive matrix organic light-emitting diodes," *Organic Light-Emitting Materials and Devices VIII*, Eds. Kafafi and Lane, *Proc. of SPIE*, 5519:242-249 (2004).

Liu et al., "New Flat electron emission light source with transparency and heat insulation properties," *Journal of Illuminating Engineer*, 28(4):1-6 (2011).

Nathan et al., "Amorphous Silicon Thin Film Transistor Circuit Integration for Organic LED Displays on Glass and Plastic," *2003 Proceedings of the Custom Integrated Circuits Conference* and *IEEE J. Solid-State Circuits* 39(9):1477-1486 (2004).

Seong et al., "Flexible AMOLED Backplane Technology Using Pentacene TFTs," *Proc. Int. Symp. Super-Functionality Organic Devices, IPAP Conf. Series*, 6:146-149 (2005).

Shin et al., "Dynamic Voltage Scaling of OLED Displays," *Proceedings of the 48th Design Automation Conference* (DAC2011), pp. 53-58 (2011).

Uttwani et al., Detection of Physical Defects in Full Color Passive-Matrix OLED Display by Image Driving Techniques, *J. Display Technology*, 8(3):154-161 (2012).

Wee and Balan, "Adaptive Display Power management for OLEDF Displays," Workshop on Mobile Gaming (MobiGames), in conjunction with ACM SIGOMM, 8:25-30 (2012).

Yang et al., "1.8 in. 128x160 Full Color Passive Matrix OLED," *Proc. of SPIE*, 6722:67224H1-67224H5 (2007).

English abstract of TW 583398.
English abstract of TW I381542.
Office Action mailed Nov. 30, 2015 in TW 10421639460.

* cited by examiner

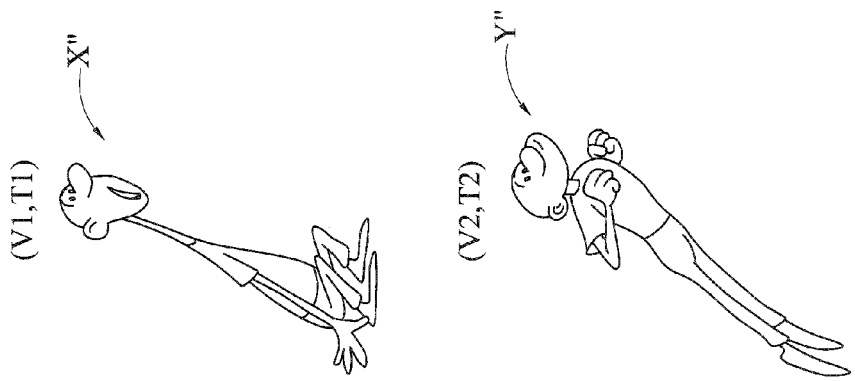
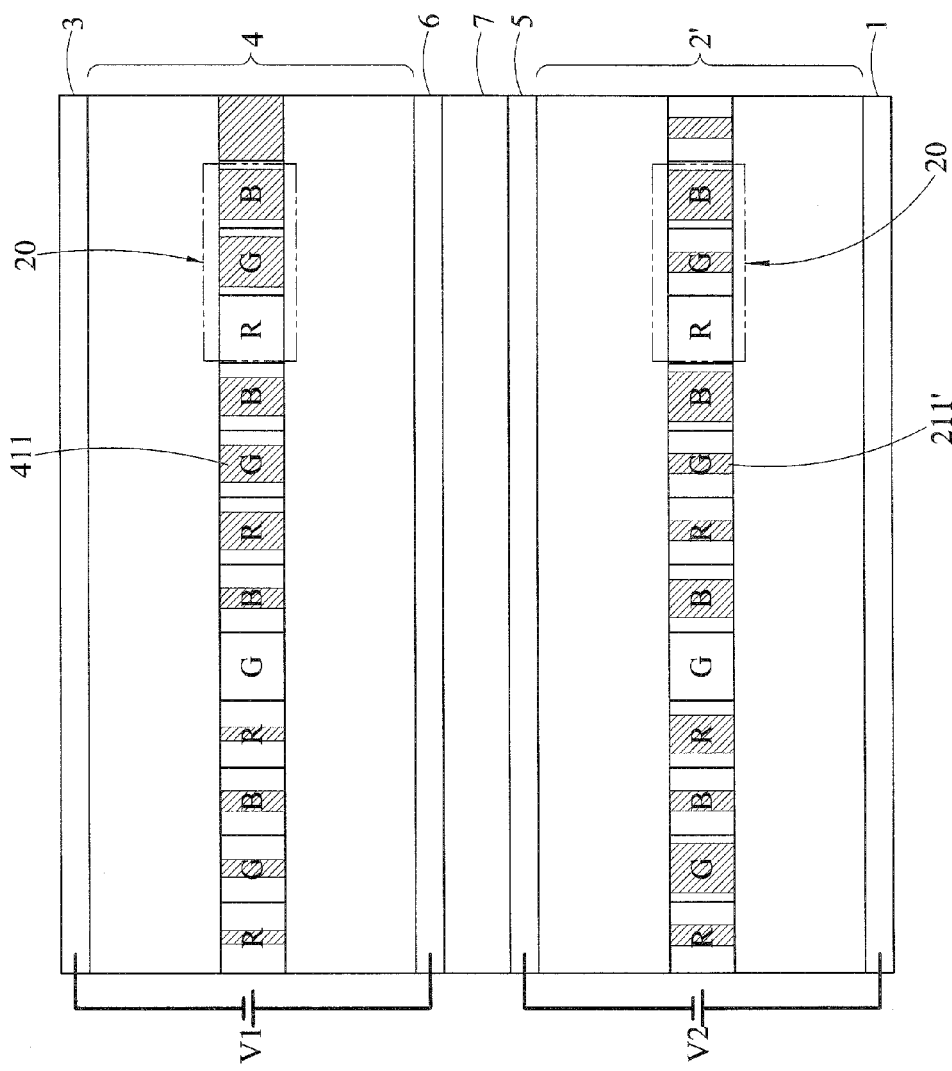
FIG. 6B
FIG. 6A

LIGHT EMITTING ELEMENT

CROSS-REFERENCE TO RELATED APPLICATIONS

This application claims foreign priority under 35 U.S.C. §119(a) to Patent Application No. 103100018, filed on Jan. 2, 2014, in the Intellectual Property Office of Ministry of Economic Affairs, Republic of China (Taiwan, R.O.C.), the entire content of which Patent Application is incorporated herein by reference.

BACKGROUND OF THE INVENTION

1. Technical Field

The present disclosure relates to light emitting elements, and, more particularly, to an organic light emitting element that generates gray-scale, full-color, three-dimensional and dynamic images.

2. Description of Related Art

Organic light emitting diodes (OLEDs) are regarded as the most promising light sources in the future. Compared with a conventional fluorescent lamp or a solid state light source such as a light emitting diode, an OLED has a light weight and a high color rendering index, generates low glare light, and is flexible and transparent. Therefore, the application of the OLEDs on illumination can be much diversified.

Currently, full-color images can be generated by passive matrix OLEDs (PMOLEDs) that control upper and lower electrodes of each pixel, or generated by active matrix OLEDs (AMOLEDs) that control brightness of each pixel through a thin film transistor (TFT).

However, to control the luminous intensity of each pixel so as to generate full-color/gray-scale images, the voltage applied to each pixel needs to be controlled through a thin film transistor, thus complicating the process. Further, TFT driving control circuits are costly, and hinder the development of low-cost organic light emitting elements.

Therefore, how to overcome the above-described drawbacks has become urgent.

SUMMARY OF THE INVENTION

The present disclosure provides a light emitting element, comprising: a first electrode layer; a second electrode layer; and an organic light emitting layer sandwiched between the first electrode layer and the second electrode layer, wherein the organic light emitting layer is patterned to include a plurality of light emitting blocks with different densities. When a voltage is applied between the first electrode layer and the second electrode layer, the light emitting element generates a gray-scale image.

In an embodiment, the light emitting blocks are performed by a color separation process to be a plurality of monochromatic blocks. When a voltage is applied between the first electrode layer and the second electrode layer, the light emitting element generates a full-color gray-scale image.

The present disclosure further provides a light emitting element, comprising: a first electrode layer; a second electrode layer; and an organic light emitting layer sandwiched between the first electrode layer and the second electrode layer, wherein the organic light emitting layer is patterned to form a plurality of light emitting blocks with different densities, the light emitting blocks are divided into a plurality of light emitting block groups that are arranged in an alternate manner. Each of the light emitting blocks is performed by a color separation process to be a monochromatic block.

In an embodiment, the light emitting block groups display a same image, and a same voltage is applied between the first electrode layer and the second electrode layer at a same time, such that the light emitting element generates a three-dimensional image.

In another embodiment, the light emitting block groups display different images, and when a same voltage is or different voltages are applied between the first electrode layer and the second electrode layer at different time, the light emitting element generates a full color dynamic image.

The present disclosure yet provides a light emitting element, comprising: a first electrode layer; a second electrode layer; a first organic light emitting layer sandwiched between the first electrode layer and the second electrode layer, wherein the first organic layer is patterned to form a plurality of first light emitting blocks with different densities; and a second organic light emitting layer sandwiched between the first organic light emitting layer and the second electrode layer, wherein the second organic layer is patterned to form a plurality of second light emitting blocks with different densities. Each of the first light emitting blocks and the second light emitting blocks is performed by a color separation process to be a monochromatic block.

In an embodiment, the light emitting element further comprises a charge generating layer sandwiched between the first organic light emitting layer and the second organic light emitting layer, the first and second light emitting blocks display a same image, and when a voltage is applied between the first electrode and the second electrode, the light emitting element generates a full color three-dimensional image.

In an embodiment, the light emitting element further comprises a common electrode layer sandwiched between the first organic light emitting layer and the second organic light emitting layer, wherein the first light emitting blocks and the second light emitting blocks display different images, and a same voltage is or different voltages are applied between the first electrode layer and the common electrode layer and between the second electrode layer and the common electrode layer at different time.

In another embodiment, the light emitting element further comprises a third electrode layer, an insulating layer and a fourth electrode layer sequentially stacked between the first organic light emitting layer and the second organic light emitting layer, wherein the first light emitting blocks and the second light emitting blocks display different images, and when a same voltage is or different voltages are applied between the first electrode layer and the third electrode layer and between the fourth electrode layer and the second electrode layer at different time, the light emitting element generates a full color dynamic image.

In an embodiment, the light emitting element further comprises a first charge generating layer sandwiched between the first organic light emitting layer and the second organic light emitting layer, a second charge generating layer sandwiched between the second organic light emitting layer and the second electrode layer, and a third organic light emitting layer sandwiched between the second charge generating layer and the second electrode layer, wherein the third organic light emitting layer is patterned to include a plurality of third light emitting blocks with different densities. Each of the first light emitting blocks is performed by a color separation process to be a first color monochromatic block, each of the second light emitting blocks is performed by the color separation process to be a second color monochromatic block, each of the third light emitting blocks is performed by the color separation process to be a third color monochromatic block, and the first color monochromatic blocks, the second color monochromatic blocks and the third color monochromatic blocks are arranged in an alternate manner or aligned with one another.

BRIEF DESCRIPTION OF THE DRAWINGS

The disclosure can be more fully understood by reading the following detailed description of the preferred embodiments, with reference made to the accompanying drawings.

FIG. 6A is a cross-sectional view of a light emitting element according to a sixth embodiment of the present invention.

FIG. 6B shows images displayed by the light emitting element according to the sixth embodiment of the present disclosure.

DETAILED DESCRIPTION OF THE INVENTION

Figure 1A:
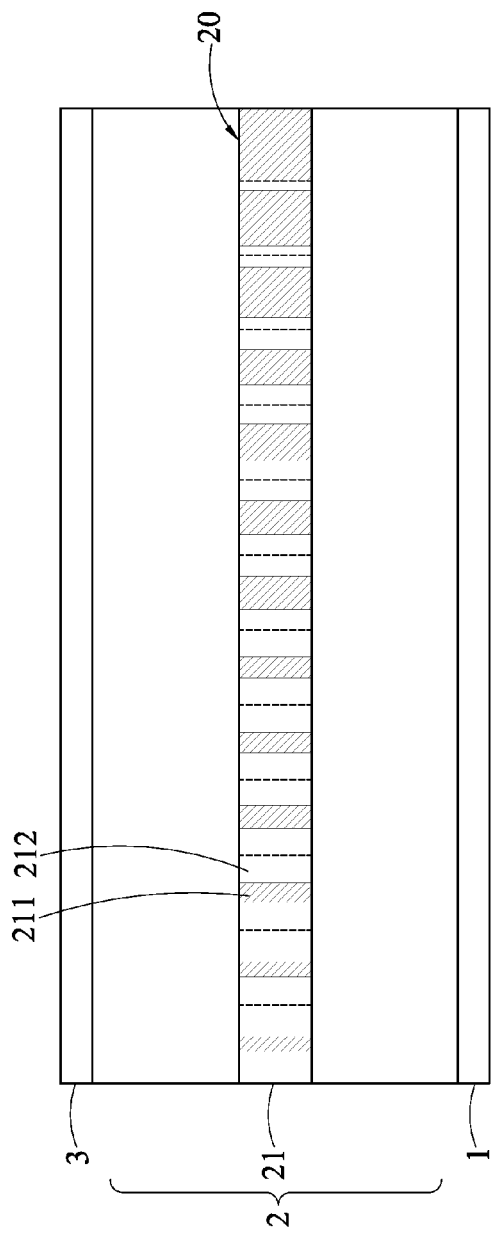
FIG. 1A is a cross-sectional view of a light emitting element according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Referring to a first embodiment of FIG. 1A, a light emitting element according to the present disclosure has a first electrode layer 1, an organic light emitting layer 2, and a second electrode layer 3 sequentially stacked on one another.

One of the first electrode layer 1 and the second electrode layer 3 is an anode electrode layer, and the other is a cathode electrode layer. The anode electrode layer is, but not limited to, a transparent electrode layer and made of ITO, IZO or any other transparent conductor material. The cathode electrode layer is, but not limited to, a reflective electrode layer and made of metal. In another embodiment, both the first electrode layer 1 and the second electrode layer 3 are transparent electrode layers.

The organic light emitting layer 2 is sandwiched between the first electrode layer 1 and the second electrode layer 3 and comprises an emitting layer 21, a hole injection layer (HIL) and a hole transport layer (HTL) are sandwiched between the emitting layer 21 and the anode electrode layer, and an electron transport layer (ETL) and an electron injection layer (EIL) are sandwiched between the emitting layer 21 and the cathode electrode layer. The emitting layer 21 of the organic light emitting layer 2 is patterned to form a plurality of light emitting blocks 211 that are arranged with different densities. In an embodiment, the light emitting blocks 211 are made of a fluorescent or phosphor material, and are insulated by an insulating material 212 from one another. As shown in FIG. 1D, the light emitting blocks 211 are composed of fluorescent or phosphor body materials 2111 and fluorescent or phosphor doped materials 2112. The insulating material 212 shown in FIG. 1A can be replaced by the fluorescent or phosphor doped materials 2112.

When a voltage is applied between the first electrode layer 1 and the second electrode layer 3, holes from the first electrode layer 1 are injected through the hole injection layer and the hole transport layer to the emitting layer 21, and electrons from the second electrode layer 3 are injected through the electron injection layer and the electron transport layer to the emitting layer 21. When the holes and the electrons are recombined in the emitting layer 21, since the emitting layer 21 has been patterned to form the light emitting blocks 211, the light emitting element shows images shown by the light emitting blocks 211.

Figure 1B:
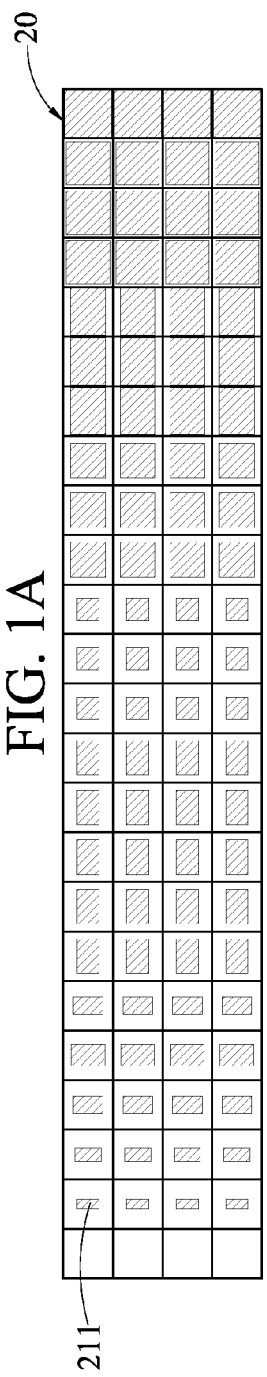
FIG. 1B is an upper view of the light emitting element according to the first embodiment of the present disclosure.
Figure 1C:
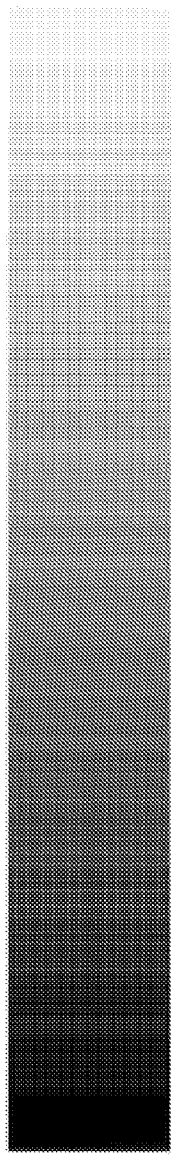
FIG. 1C shows a gray-scale image generated by the light emitting element according to the first embodiment of the present disclosure.
Figure 1D:
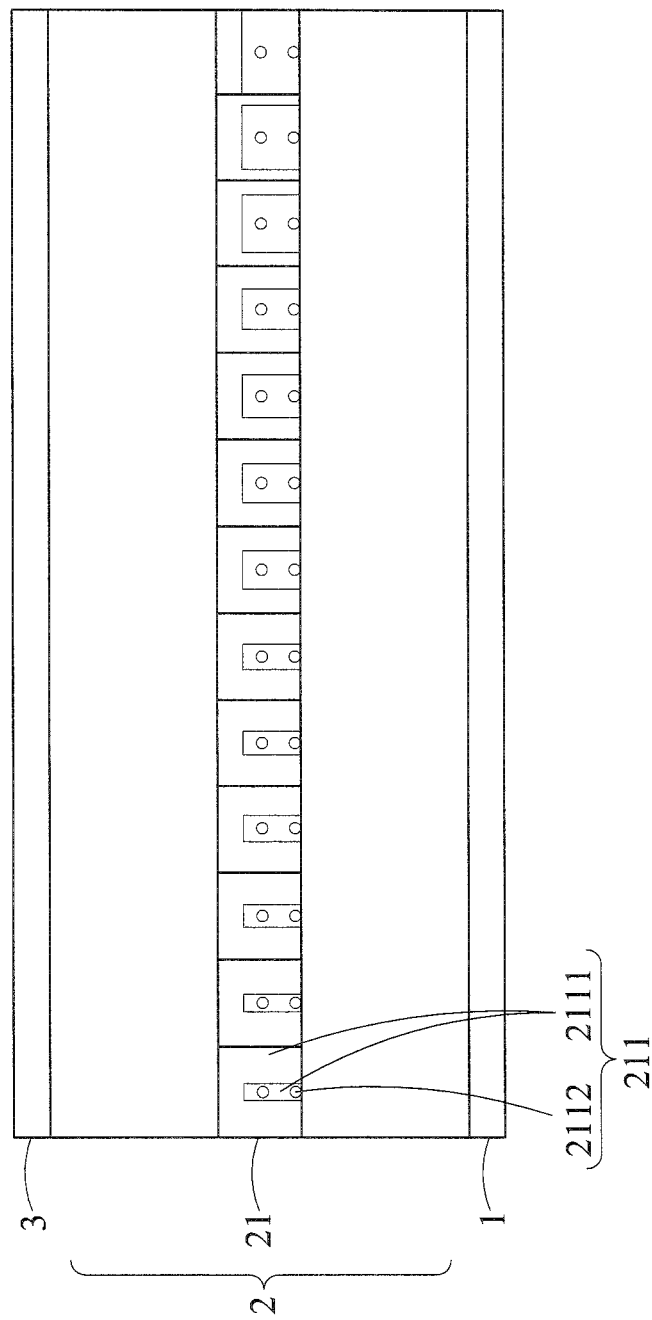
FIG. 1D is a cross-sectional view of a light emitting element according to an embodiment of the present disclosure.

Referring to FIG. 1B, the light emitting element has a plurality of pixels 20, each of which has the same number of the light emitting blocks 211. In an embodiment, the light emitting blocks 211 have different area but the same pitch (which is referred to a distance between the centers of two adjacent light emitting blocks 211). FIG. 1C shows a gray-scale image generated by the light emitting element according to the first embodiment of the present disclosure. In an embodiment, the pixels may have different numbers of the light emitting blocks 211, and the light emitting blocks 211 may have the same area but different pitches.

It is known from the first embodiment of FIGS. 1A-1D, by arranging the light emitting blocks 211 with different densities, including changing the size or pitches of the light emitting blocks 211 or the number of the light emitting blocks 211 of each pixel, the light emitting element can be controlled to generate a gray-scale image.

Figure 2A:
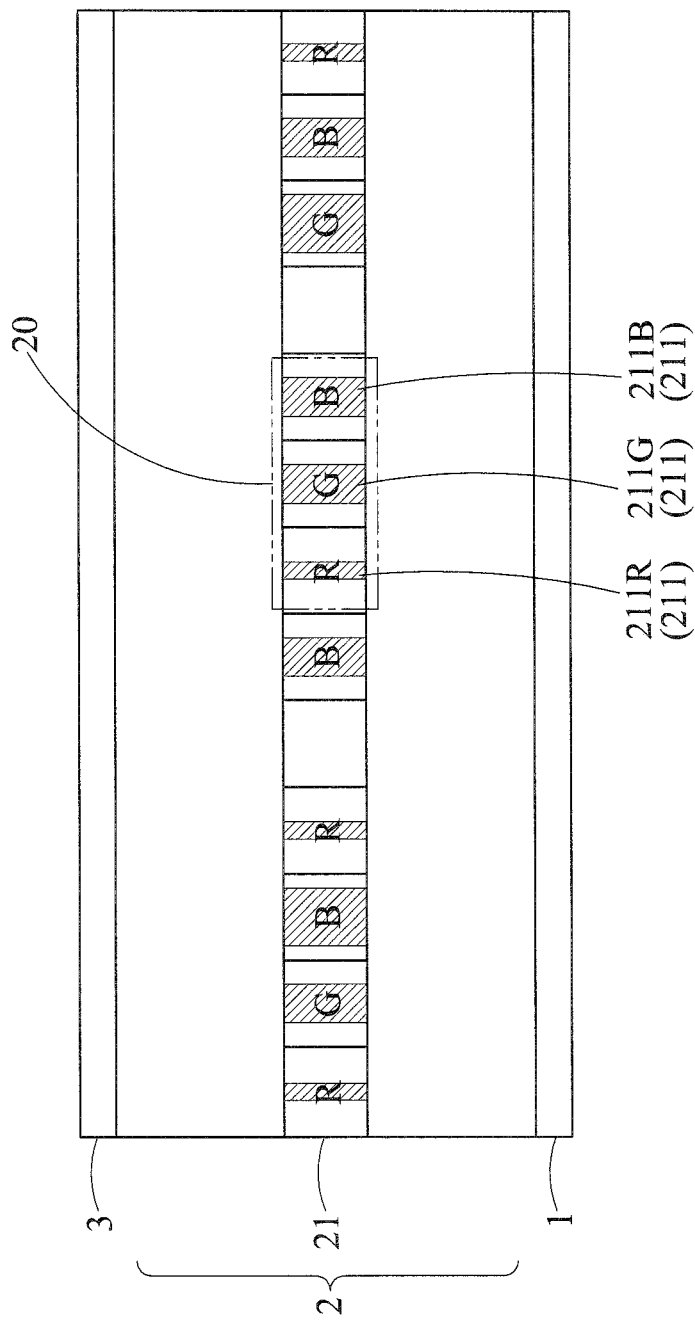
FIG. 2A is a cross-sectional view of a light emitting element according to a second embodiment of the present disclosure.
Figure 2B:
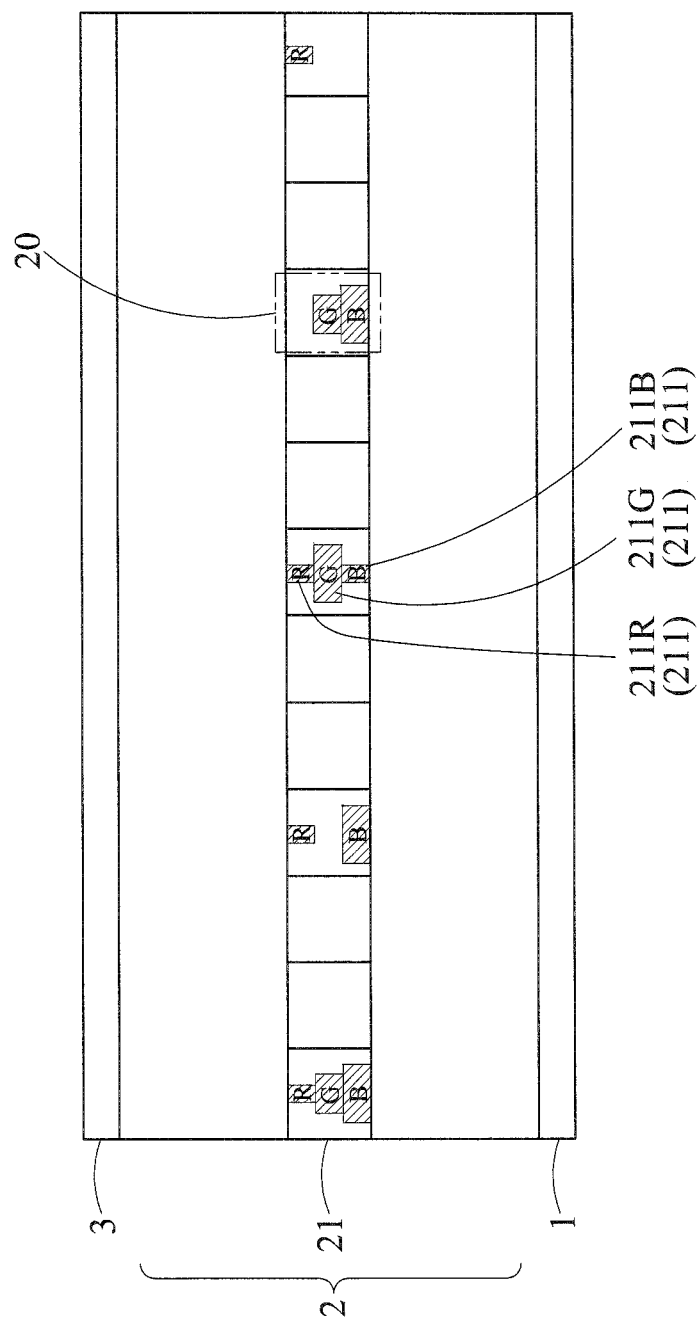
FIG. 2B is a cross-sectional view of a light emitting element according to an embodiment of the second embodiment of the present disclosure.

FIGS. 2A and 2B illustrate a light emitting element according to a second embodiment of the present disclosure. The light emitting blocks 211 of the emitting layer 21 of the organic light emitting layer 2 are performed by a color separation process to be a plurality of monochromatic blocks 211R, 211G and/or 211B that are red blocks (R), green blocks (G) and blue blocks (B), respectively. Therefore, by arranging the light emitting blocks 211 that are formed to be the monochromatic blocks 211R, 211G and 211B with different densities, including changing the size or pitches of the light emitting blocks or the number of the light emitting blocks included in each pixel, the light emitting element according to the present disclosure generates a full-color/gray-scale image. The monochromatic blocks 211R, 211G and 211B can be arranged in parallel with one another, without being overlapped, as shown in FIG. 2A, or perpendicularly arranged, with one overlapped by another, as shown in FIG. 2B.

Figure 2C:
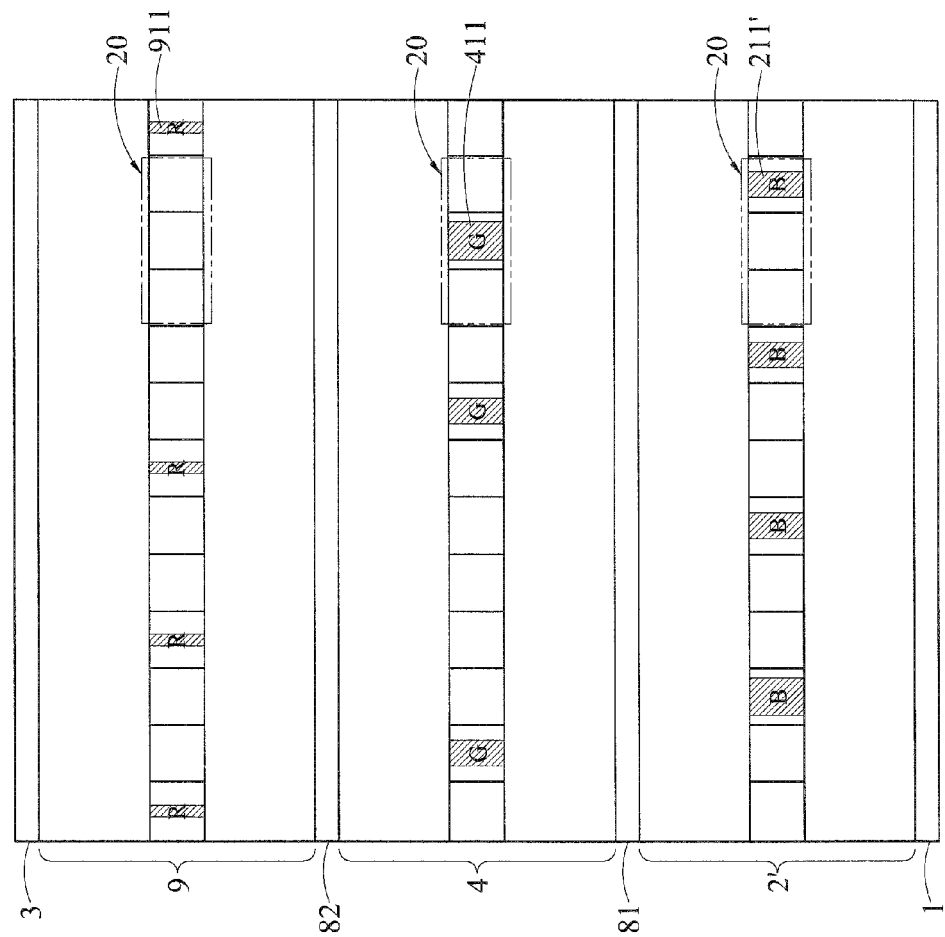
FIG. 2C is a cross-sectional view of a light emitting element according to another embodiment of the second embodiment of the present disclosure.
Figure 2D:
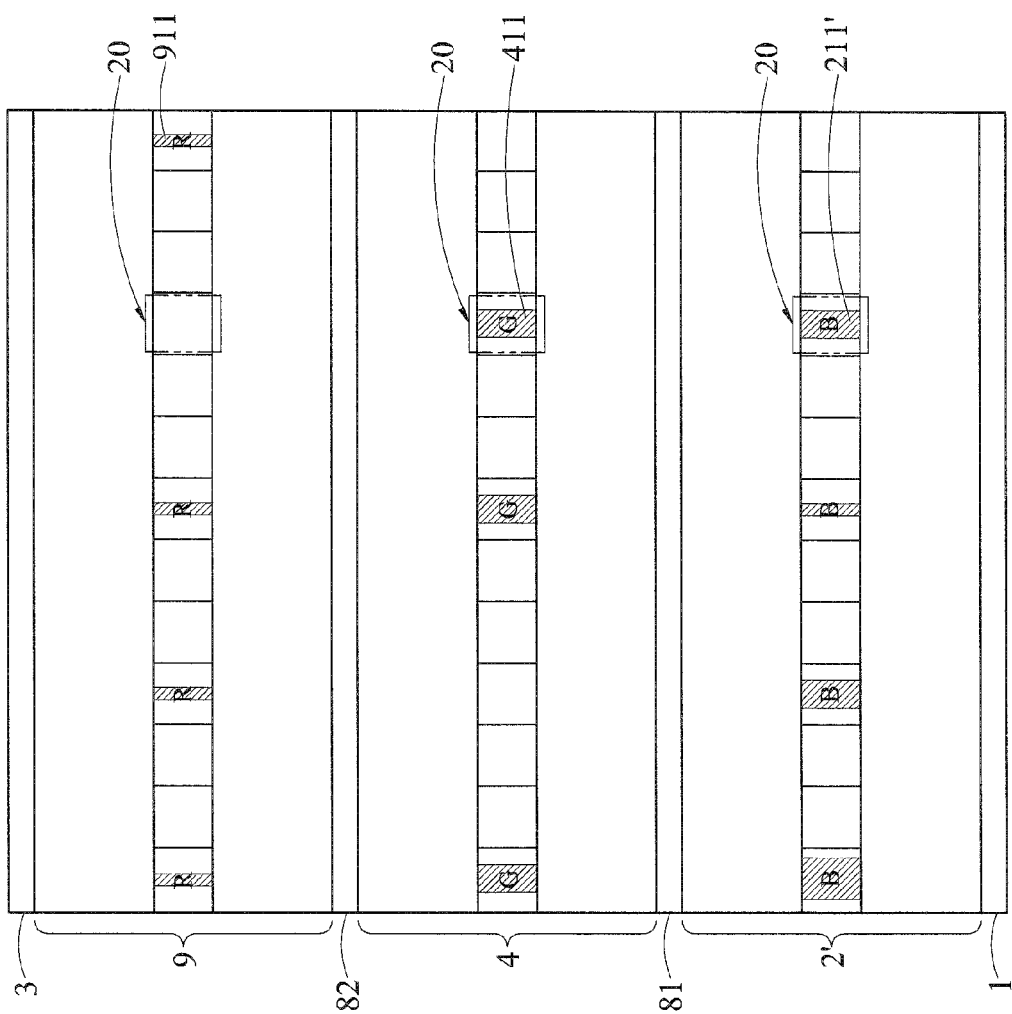
FIG. 2D is a cross-sectional view of a light emitting element according to yet another embodiment of the second embodiment of the present disclosure.

The monochromatic blocks 211R, 211G and 211B included in each pixel 20 can be located at different layers of organic light emitting layers, as shown in FIGS. 2C and 2D.

In FIG. 2C, a first organic light emitting layer 2', a first charge generating layer 81, a second organic light emitting layer 4, a second charge generating layer 82 and a third organic light emitting layer 9 are stacked sequentially between the first electrode layer 1 and the second electrode layer 3 of the light emitting element. The first organic light emitting layer 2' is patterned to include a plurality of first light emitting blocks 211', and each of first light emitting blocks 211' is performed by a color separation process to be a first monochromatic block (B is used to indicate first color in the drawing). The second organic light emitting layer 4 is patterned to include a plurality of second light emitting blocks 411, and each of second light emitting blocks 411 is performed by a color separation process to be a second monochromatic block (G is used to indicate second color in the drawing). The third organic light emitting layer 9 is patterned to include a plurality of third light emitting blocks 911, and each of third light emitting blocks 911 is performed by a color separation process to be a third monochromatic block (R is used to indicate third color in the drawing). In the embodiment shown in FIG. 2C, the first color monochromatic block of the first organic light emitting layer 2', the second color monochromatic block of the second organic light emitting layer 4, and the third color monochromatic block of the third organic light emitting layer 9 are arranged in an alternate manner. Therefore, when the light emitting element emits light from the first electrode layer 1 or from the second electrode layer 3, the first light emitting blocks 211', the second light emitting blocks 411, and the third light emitting blocks 911 that a user sees are arranged in parallel with one another, and the color of each pixel is determined by the area ratio of the first color monochromatic block, the second color monochromatic block and the third monochromatic block that are arranged in an alternate manner.

FIG. 2D differs from FIG. 2C in that in FIG. 2D when the light emitting element emits light from the first electrode layer 1 or the second electrode layer 3, the first light emitting blocks 211', the second light emitting blocks 411, and the third light emitting blocks 911 that a user sees are vertically arranged, and the color of each pixel 20 is determined by stacking the color generated by the first monochromatic block, the second monochromatic block and the third monochromatic block that are partially aligned. Therefore, the resolution of the light emitting element shown in FIG. 2D is about three times greater than the resolution of the light emitting element shown in FIG. 2A.

Figure 3A:
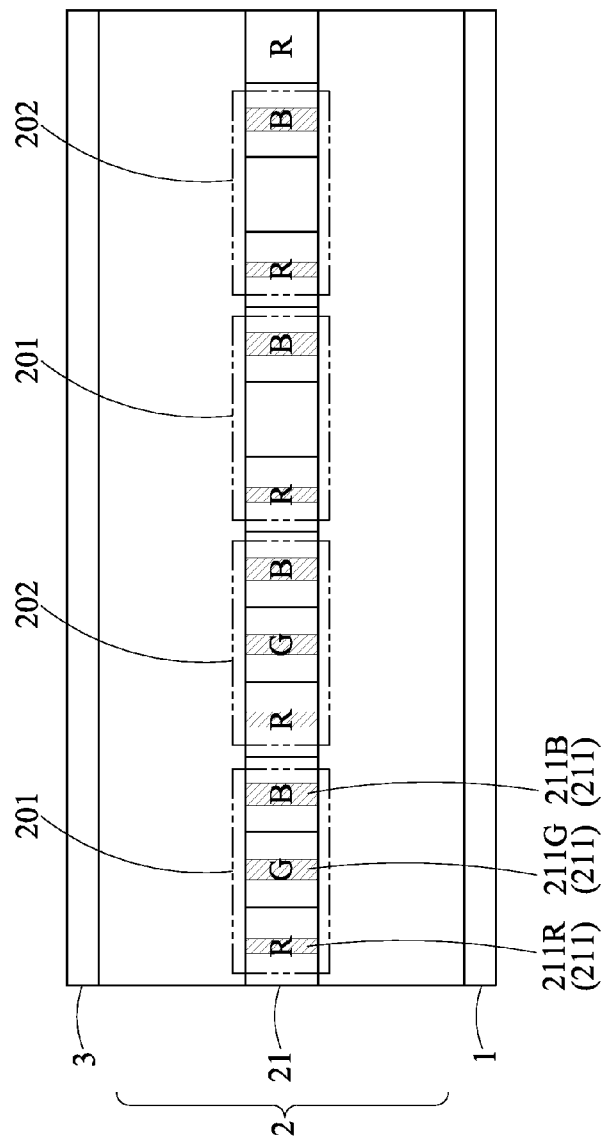
FIG. 3A is a cross-sectional view of a light emitting element according to a third embodiment of the present disclosure.
Figure 3B:
FIG. 3B shows images displayed by the light emitting element according to the third embodiment of the present disclosure.

FIGS. 3A and 3B show a light emitting element according to a third embodiment of the present disclosure. The light emitting blocks of the emitting layer 21 of the light emitting element are divided into a plurality of light emitting block groups, and any one of the light emitting block groups is alternatively disposed with another one. The light emitting block groups display the same images. As shown in FIG. 3A, the light emitting blocks 211 (the monochromatic blocks 211R, 211G and 211B) are divided into a first light emitting block group 201 and a second light emitting block group 202 that is alternatively disposed with the first light emitting block group 201. When a voltage is applied between the first electrode layer 1 and the second electrode layer 3, the first light emitting block group 201 displays an image X, and the second light emitting block group 202 displays an image Y that is the same as the image X, as shown in FIG. 3B. As such, when a viewer views two images from different viewing angles of the right and left eyes, his brain combines the two images from both eyes into a three-dimensional image.

Figure 4A:
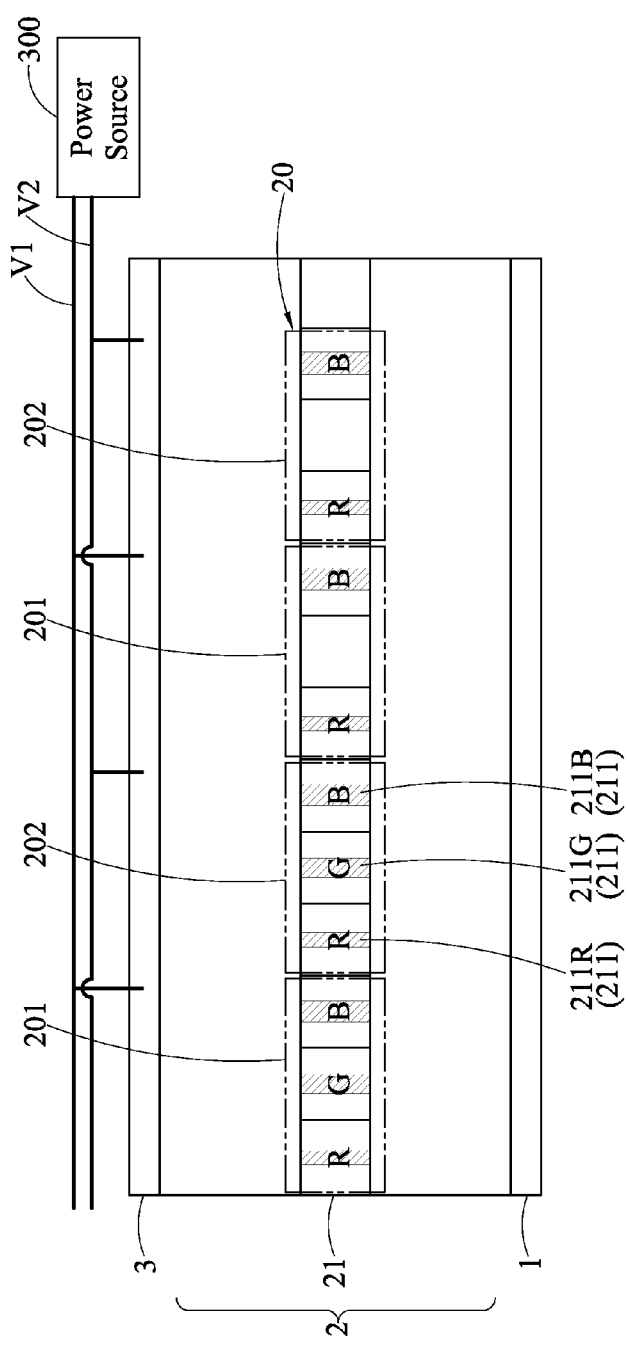
FIG. 4A is a cross-sectional view of a light emitting element according to a fourth embodiment of the present disclosure.
Figure 4B:
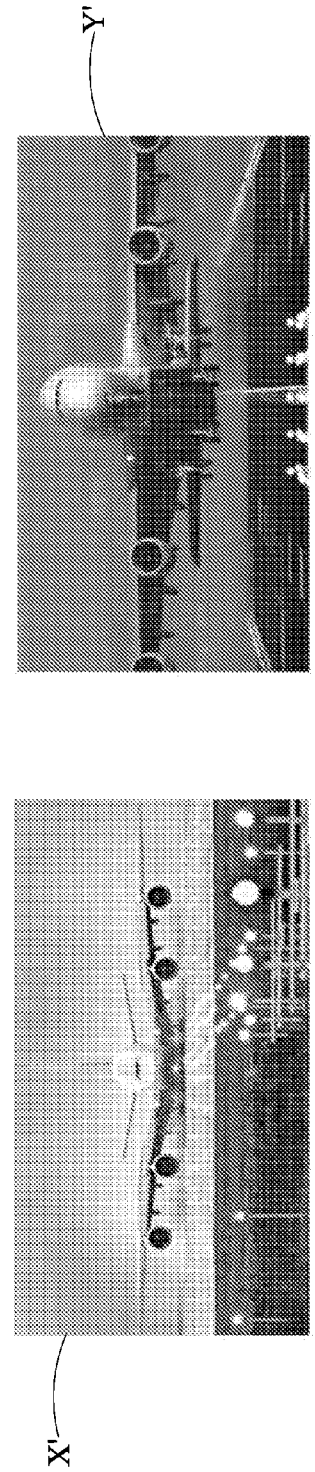
FIG. 4B shows images displayed by the light emitting element according to the fourth embodiment of the present disclosure.

FIGS. 4A and 4B show a light emitting element according to a fourth embodiment of the present disclosure. The fourth embodiment differs from the third embodiment in that the light emitting block groups of the light emitting element of the fourth embodiment display different images and a same or different voltages are applied to the light emitting block groups at different time. As shown in FIG. 4A, a power source 300 supplies a first voltage V1 and a second voltage V2 to electrodes in the second electrode layer 3 that correspond to the first electrode pattern group 201 and the second electrode pattern group 202, respectively, at different time. As shown in FIG. 4B, at a first time the first voltage V1 is switched on and the second voltage V2 is switched off such that the first light emitting block group 201 displays an image X'. At a second time, the first voltage V1 is switched off and the second voltage V2 is switched on such that the second light emitting block group 202 shows an image Y'. As such, the light emitting element generates a dynamic image.

Further, the first voltage V1 and the second voltage V2 can have a parallel type regular image circuit configuration, a parallel type irregular image circuit configuration, a series type regular image circuit configuration or a series type irregular image circuit configuration. In correspondence with each pixel 20, light emitting blocks in the emitting layer 21 can be arranged in parallel with one another, without being overlapped, as shown in FIG. 2A, or perpendicularly arranged, with one overlapped by another, as shown in FIG. 2B. The monochromatic blocks 211R, 211G and 211B that are different in color are distributed on different organic light emitting layers and are arranged in parallel with one another, without being overlapped, like the first organic light emitting layer 2', the second organic light emitting layer 4 and the third organic light emitting layer 9 shown in FIG. 2C, or are distributed on different organic light emitting layers and are vertically arranged and partially overlapped, as shown in FIG. 2D.

Figures 5A, 5B:
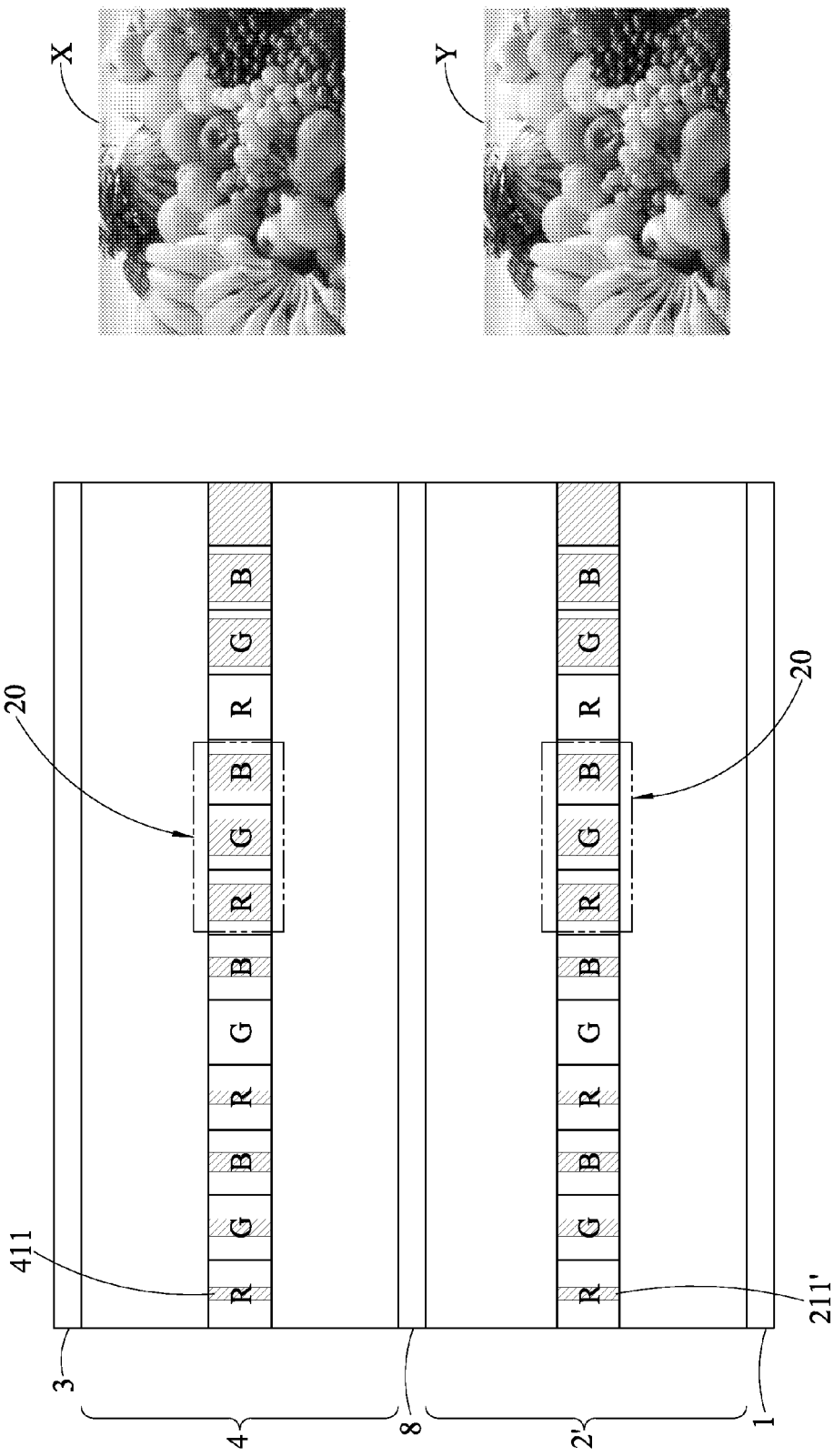
FIG. 5A is a cross-sectional view of a light emitting element according to a fifth embodiment of the present disclosure.
FIG. 5B shows images displayed by the light emitting element according to the fifth embodiment of the present disclosure.

FIGS. 5A and 5B show a light emitting element according to a fifth embodiment of the present disclosure. As shown in FIG. 5A, the light emitting element comprises a first electrode layer 1, a first organic light emitting layer 2', a charge generating layer 8, a second organic light emitting layer 4 and a second electrode layer 3 sequentially stacked on one another. The first organic light emitting layer 2' is patterned to include a plurality of first light emitting blocks 211' with different densities. The second organic light emitting layer 4 is patterned to include a plurality of second light emitting blocks 411 with different densities. In each pixel 20 of the light emitting element, the first light emitting blocks 211' of the first organic light emitting layer 2' can be monochromatic red (R), blue (B) and green (G) blocks, and the second light emitting blocks 411 of the second organic light emitting layer 4 can be monochromatic red (R), blue (B) and green (G) blocks.

When a voltage is applied between the first electrode layer 1 and the second electrode layer 3, since there are the first and second organic light emitting layers 2' and 4, the light emitting element generates two identical images X and Y in a vertical direction, as shown in FIG. 5B. When the two images are viewed at different distances from a viewer, the two images have differences in brightness and color. As such, the two images are combined to generate a three-dimensional image. In correspondence with each pixel 20, the first light emitting blocks 211' in the first organic light emitting layer 2' can be arranged in parallel with one another, without being overlapped, as shown in FIG. 2A, or be vertically arranged and partially overlapped, as shown in FIG. 2B. Of course, the second light emitting blocks 411 in the second organic light emitting layer 4 can also have these variations.

Refer to FIGS. 6A and 6B. The light emitting element of the sixth embodiment further has a third electrode layer 5, an insulating layer 7 and a fourth electrode layer 6 sequentially stacked between the first organic light emitting layer 2' and the second organic light emitting layer 4. Referring to FIG. 6A, the first electrode layer 1 and the fourth electrode layer 6 are anode electrode layers, and the third electrode layer 5 and the second electrode layer 3 are cathode electrode layers. Hole injection/transport layers and electron injection/transport layers exist between the first organic light emitting layer 2' and the first electrode layer 1 and the third electrode layer 5, respectively, and hole injection/transport layers and electron injection/transport layers exist between the second organic light emitting layer 4 and the fourth electrode layer 6 and the second electrode layer 3. Of course, the anode electrode layer and the cathode electrode layer can be exchanged, and the electron injection/transport layers and hole injection/transport layers are changed accordingly. Referring to FIG. 6B, the first light emitting blocks 211' display an image Y", and the second light emitting blocks 411 display an image X". Further, a same or different voltages is applied between the first electrode layer 1 and the third electrode layer 5 and between the fourth electrode layer 6 and the second electrode layer 3 at different time.

Figure 7:
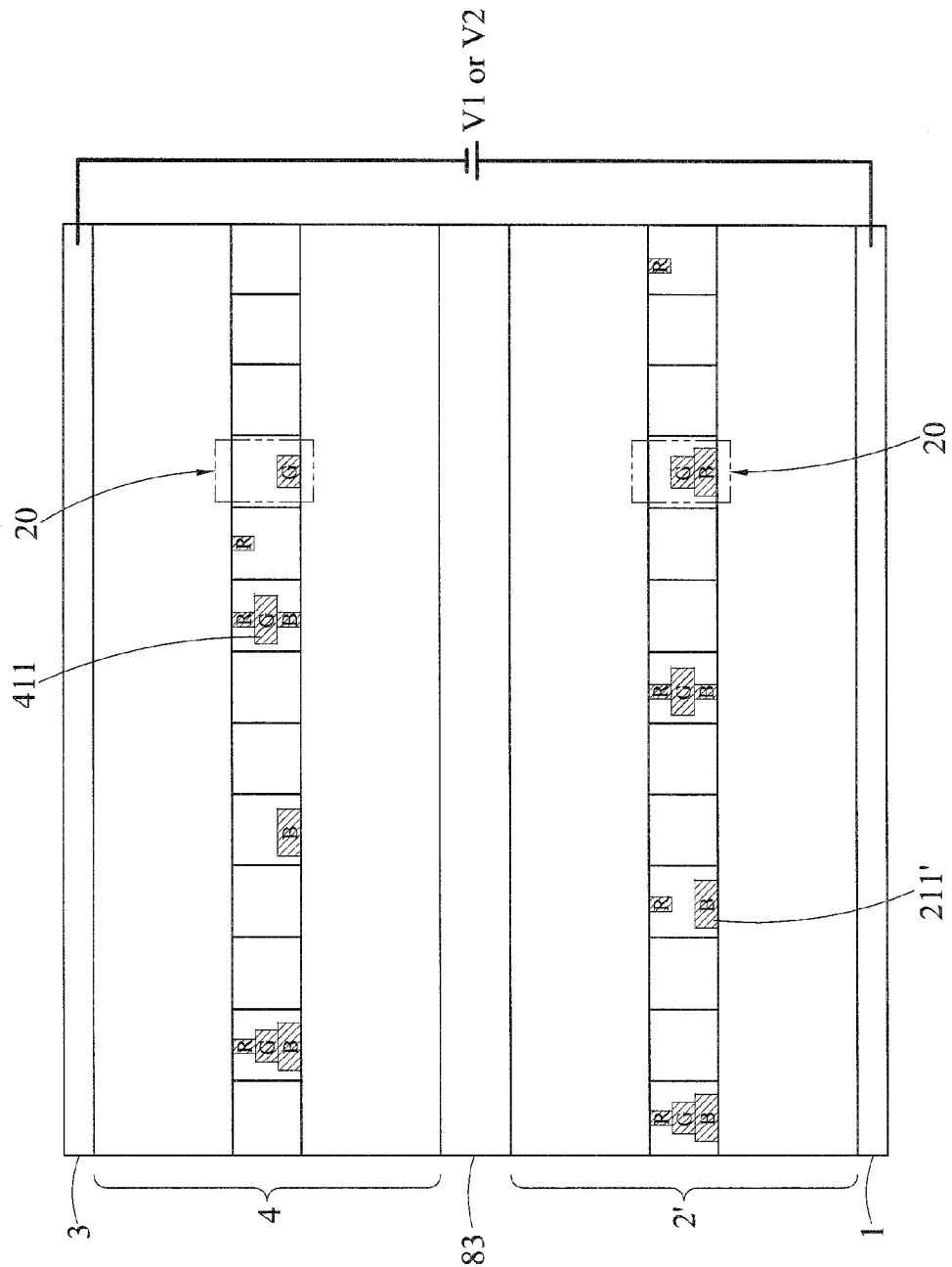
FIG. 7 is a cross-sectional view of a light emitting element according to a seventh embodiment of the present disclosure.

Refer to FIG. 7. Compared with the sixth embodiment, in the seventh embodiment a buffer layer 83 replaces the third electrode layer 5, the insulating layer 7 and the fourth electrode layer 6, and different voltage V1 or V2 is applied between the first electrode layer 1 and the second electrode layer 3 at different time, wherein the first electrode layer 1 is an anode electrode layer, and the second electrode layer 3 is a cathode electrode layer. The buffer layer 83 can be deemed as a modulate layer that changes the position where the electrons and holes are combined when different voltages are applied by using the energy level design of the organic light emitting layer (e.g., the first organic light emitting layer 2' and the second organic light emitting layer 4). For example, when the voltage V1 is applied, the electrons and the holes are combined in the second organic light emitting layer 4, which renders the light emitting element to display an image X"; and when the voltage V2 is applied, the electrons and the holes are combined in the first organic light emitting layer 2', which renders the light emitting element to display an image Y".

Figure 8:
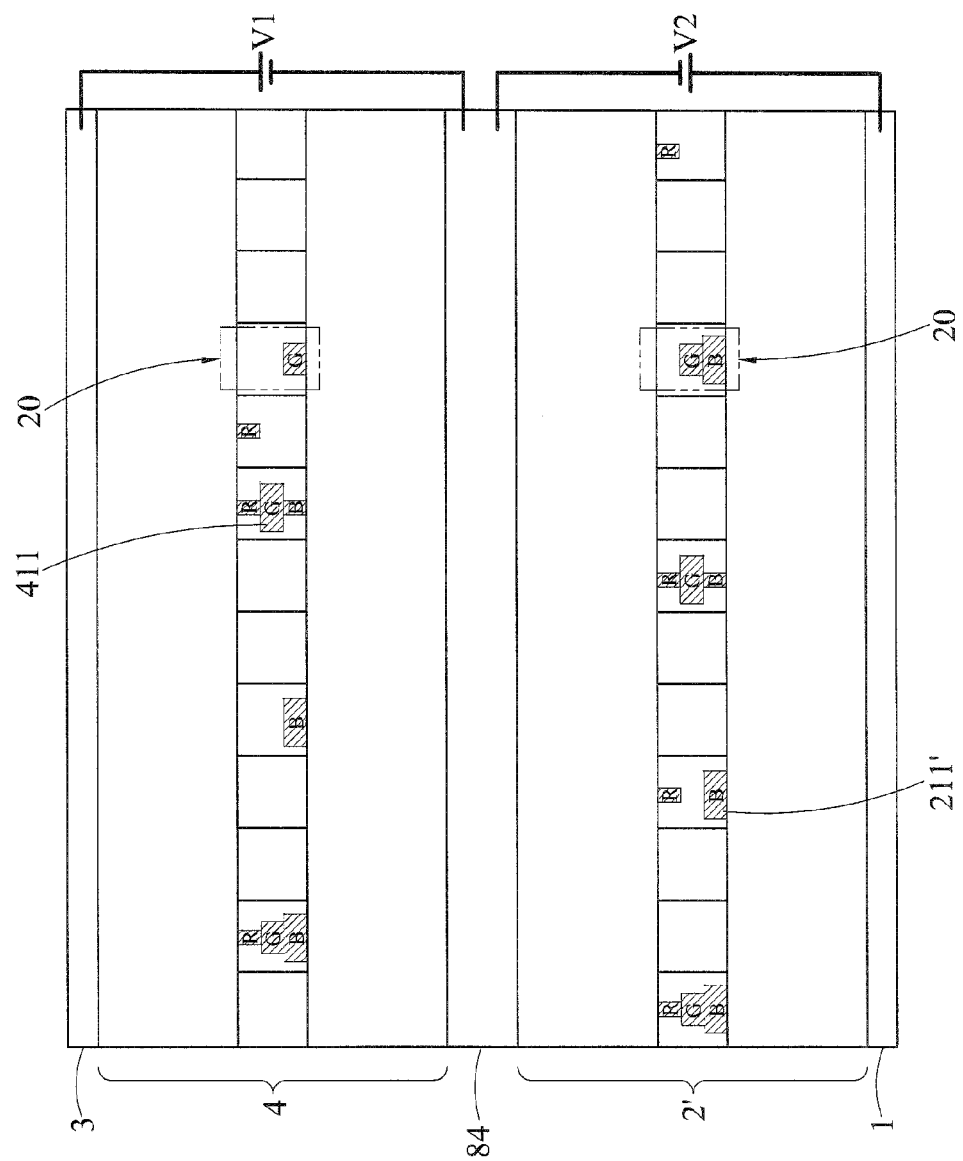
FIG. 8 is a cross-sectional view of a light emitting element according to an eighth embodiment of the present disclosure.

Refer to FIG. 8. Compared with the seventh embodiment, in the eighth embodiment a common electrode layer 84 replaces the buffer layer 83. In the eighth embodiment, the first electrode layer 1 and the second electrode layer 3 are anode electrodes, and the common electrode layer 84 is a cathode electrode. A same or different voltage can be applied between the first electrode layer 1 and the common electrode layer 84 and between the common electrode layer 84 and the second electrode layer 3 at different time. For example, a first voltage V1 is applied between the second electrode layer 3 and the common electrode layer 84 at first time, while a second voltage V2 is applied between the common electrode layer 84 and the first electrode layer 1 at second time, so that the light emitting element generates dynamic images.

In the fifth, sixth, seventh and eighth embodiments, the first light emitting blocks 211' have different sizes or pitches and can be monochromatic red (R), green (G) or blue (B) blocks, the second light emitting blocks 411 have different sizes or pitches, and can be monochromatic red (R), green (G) or blue (B) blocks. In correspondence with each pixel 20, the first light emitting blocks 211' in the first organic light emitting layer 2' can be arranged in parallel with one another, without being overlapped, as shown in FIG. 5A, or be vertically arranged and partially overlapped, as shown in FIG. 6. Of course, the second light emitting blocks 411 in the second organic light emitting layer 4 can also have these variations.

According to the present disclosure, the organic light emitting layers are patterned to form a plurality of light emitting blocks arranged with different densities. As such, when a voltage is applied between the first electrode layer and the second electrode layer, the light emitting element of the present disclosure generates a gray-scale image, thereby eliminating the need to control each pixel through a thin film transistor as in the prior art. Further, the organic light emitting layers can be performed by a color separation process to be a plurality of R, G and B monochromatic blocks. Since the light emitting blocks (monochromatic blocks) have different sizes or pitches, the light emitting element (monochromatic blocks) can generate a full-color/gray-scale image. Furthermore, by arranging the light emitting blocks in a vertical direction or a horizontal direction and applying voltages of suitable values and time sequences on the electrode layers, the light emitting element of the present disclosure can generate a three-dimensional or dynamic image.

It will be apparent to those skilled in the art that various modifications and variations can be made to the disclosed embodiments. It is intended that the specification and examples be considered as exemplary only, with a true scope of the disclosure being indicated by the following claims and their equivalents.

We claim:
1. A light emitting element, comprising:
a first electrode layer;
a second electrode layer; and
an organic light emitting layer sandwiched between the first electrode layer and the second electrode layer and including a plurality of light emitting blocks with different densities, wherein the first electrode layer and the second electrode layer are free from being connected to a thin film transistor (TFT) or a chiplet.

2. The light emitting element of claim 1, wherein the light emitting blocks have different sizes or pitches.

3. The light emitting element of claim 1, wherein each of the light emitting blocks is performed by a color separation process to be a monochromatic block.

4. The light emitting element of claim 3, wherein the monochromatic blocks are not overlapped.

5. The light emitting element of claim 3, wherein the monochromatic blocks are overlapped.

6. A light emitting element, comprising:
a first electrode layer;
a second electrode layer; and
an organic light emitting layer sandwiched between the first electrode layer and the second electrode layer and including a plurality of light emitting blocks with different densities, the light emitting blocks being at least divided into a first light emitting block group with a portion of the light emitting blocks and a second light emitting block group with another portion of the light emitting blocks, the first light emitting block group and the second light emitting block group being arranged in an alternate manner,
wherein the first electrode layer and the second electrode layer are free from being connected to a thin film transistor (TFT) or a chiplet.

7. The light emitting element of claim 6, wherein each of the light emitting blocks is performed by a color separation process to be a monochromatic block.

8. The light emitting element of claim 7, wherein the light emitting block groups display a same image, and a same voltage is applied between the first electrode layer and the second electrode layer at a same time.

9. The light emitting element of claim 7, wherein the light emitting block groups display different images, and a same voltage is or different voltages are applied between the first electrode layer and the second electrode layer at different time.

10. A light emitting element, comprising:
a first electrode layer;
a second electrode layer;
a first organic light emitting layer sandwiched between the first electrode layer and the second electrode layer and including a plurality of first light emitting blocks with different densities; and
a second organic light emitting layer sandwiched between the first organic light emitting layer and the second electrode layer and including a plurality of second light emitting blocks with different densities.

11. The light emitting element of claim 10, wherein each of the first and second light emitting blocks is performed by a color separation process to be a monochromatic block.

12. The light emitting element of claim 11, wherein the first light emitting blocks are not overlapped, and the second light emitting blocks are not overlapped.

13. The light emitting element of claim 11, wherein the first light emitting blocks are overlapped, and the second light emitting blocks are overlapped.

14. The light emitting element of claim 10, further comprising a charge generating layer sandwiched between the first organic light emitting layer and the second organic light emitting layer, wherein the first light emitting blocks and the second light emitting blocks display a same image, and a same voltage is applied between the first electrode layer and the second electrode layer.

15. The light emitting element of claim 10, further comprising a common electrode layer sandwiched between the first organic light emitting layer and the second organic light emitting layer, wherein the first light emitting blocks and the second light emitting blocks display different images, and a same voltage is or different voltages are applied between the first electrode layer and the common electrode layer and between the second electrode layer and the common electrode layer at different time.

16. The light emitting element of claim 10, further comprising a third electrode layer, an insulating layer and a fourth electrode layer sequentially stacked between the first organic light emitting layer and the second organic light emitting layer, wherein the first light emitting blocks and the second light emitting blocks display different images, and a same voltage is or different voltages are applied between the first electrode layer and the third electrode layer and between the fourth electrode layer and the second electrode layer at different time.

17. The light emitting element of claim 10, further comprising a buffer layer sandwiched between the first organic light emitting layer and the second organic light emitting layer, wherein the first light emitting blocks and the second light emitting blocks display different images, and different voltages are applied between the first electrode layer and the second electrode layer at different time.

18. The light emitting element of claim 10, further comprising a first charge generating layer sandwiched between the first organic light emitting layer and the second organic light emitting layer, a second charge generating layer sandwiched between the second organic light emitting layer and the second electrode layer, and a third organic light emitting layer sandwiched between the second charge generating layer and the second electrode layer, wherein the third organic light emitting layer is patterned to include a plurality of third light emitting blocks with different densities.

19. The light emitting element of claim 18, wherein each of the first light emitting blocks is performed by a color separation process to be a first color monochromatic block, each of the second light emitting blocks is performed by the color separation process to be a second color monochromatic block, each of the third light emitting blocks is performed by the color separation process to be a third color monochromatic block, and the first color monochromatic blocks, the second color monochromatic blocks and the third color monochromatic blocks are arranged in an alternate manner.

20. The light emitting element of claim 18, wherein each of the first light emitting blocks is performed by a color separation process to be a first color monochromatic block, each of the second light emitting blocks is performed by the color separation process to be a second color monochromatic block, each of the third light emitting blocks is performed by the color separation process to be a third color monochromatic block, and the first color monochromatic blocks, the second color monochromatic blocks and the third color monochromatic blocks are aligned with one another.

21. The light emitting element of claim 10, wherein the first light emitting blocks have different sizes or pitches, and the second light emitting blocks have different sizes and pitches.

* * * * *